United States Patent
Roy

(10) Patent No.: US 8,643,063 B2
(45) Date of Patent: Feb. 4, 2014

(54) MULTIDIRECTIONAL TWO-PHASE CHARGE-COUPLED DEVICE

(75) Inventor: François Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 754 days.

(21) Appl. No.: 12/821,785

(22) Filed: Jun. 23, 2010

(65) Prior Publication Data

US 2010/0327325 A1  Dec. 30, 2010

(30) Foreign Application Priority Data

Jun. 24, 2009 (FR) .................................... 09 54296

(51) Int. Cl.
*H01L 29/80* (2006.01)

(52) U.S. Cl.
USPC ....... 257/215; 257/225; 257/248; 257/E27.15

(58) Field of Classification Search
USPC ......... 257/215, 225, 226, 242, 244, 246, 248, 257/330, 331, E27.15
See application file for complete search history.

(56) References Cited

U.S. PATENT DOCUMENTS

| | | | |
|---|---|---|---|
| 4,926,225 A | 5/1990 | Hosack | |
| 5,029,321 A | 7/1991 | Kimura | |
| 5,055,900 A | 10/1991 | Fossum et al. | |
| 2010/0327326 A1* | 12/2010 | Roy | 257/225 |
| 2010/0327327 A1* | 12/2010 | Roy | 257/225 |

FOREIGN PATENT DOCUMENTS

| | | |
|---|---|---|
| EP | 0 418 500 A2 | 3/1991 |
| JP | 56013769 A | 2/1981 |
| JP | 04045548 A | 2/1992 |

OTHER PUBLICATIONS

French Search Report dated Jan. 15, 2010 from corresponding French Application No. 09/54296.
French Search Report dated Jan. 15, 2010 from related French Application No. 09/54295.
French Search Report dated Jan. 15, 2010 from related French Application No. 09/54294.

* cited by examiner

Primary Examiner — Jack Chen
(74) Attorney, Agent, or Firm — Wolf, Greenfield & Sacks, P.C.

(57) ABSTRACT

A charge transfer device formed in a semiconductor substrate and including an array of electrodes distributed in rows and columns, wherein: each electrode is formed in a cavity with insulated walls formed of a groove which generally extends in the row direction, having a first end closer to an upper row and a second end closer to a lower row; and the electrodes of two adjacent rows are symmetrical with respect to a plane orthogonal to the sensor and comprising the direction of a row.

10 Claims, 6 Drawing Sheets

MULTIDIRECTIONAL TWO-PHASE CHARGE-COUPLED DEVICE

CROSS REFERENCE TO RELATED APPLICATIONS

This application claims the priority benefit of French patent application Ser. No. 09/54296, filed on Jun. 24, 2009, entitled "MULTIDIRECTIONAL TWO-PHASE CHARGE-COUPLED DEVICE," which is hereby incorporated by reference to the maximum extent allowable by law.

BACKGROUND OF THE INVENTION

1. Field of the Invention

The present invention relates to charge-coupled devices or CCDs. It more specifically aims at a two-phase CCD array device in which charge packets of two adjacent lines are transferred according to opposite directions. A preferred application to a CCD image sensor will be described hereafter, it being understood that the present invention may apply to any type of CCD.

2. Discussion of the Related Art

The charge transfer in a CCD is often carried out in four phases, that is, the shifting of a charge packet from one pixel to an adjacent pixel takes four steps corresponding to four periods of a clock driving the transfer.

FIGS. 1A to 1C schematically show a portion of a four-phase charge-coupled image sensor. FIG. 1A is a top view, FIG. 1B is a cross-section view along plane B-B of FIG. 1A, and FIG. 1C is a cross-section view along plane C-C of FIG. 1A.

An N-type doped layer 3 is arranged on a P-type doped silicon substrate 1. Substrate 1 and layer 3 form the photoconversion area of the sensor. The upper portion of the photoconversion area is divided into a plurality of lines 5 separated by insulation rows 7, for example formed of trenches filled with oxide. Columns of insulated electrodes 9, for example, made of polysilicon, equidistant and perpendicular to lines 5 are arranged above layer 3. A thin oxide layer 11 deposited at the surface of layer 3 insulates electrodes 9 from layer 3. Electrodes 9, properly biased, define in each line 5 a succession of potential wells where electric charges can be stored. In the shown example, a pixel is defined in each line by four successive electrodes G1 to G4. The potential well corresponding to such a pixel is created by application of a high voltage, for example, on the order of 5 V, to electrodes G2 and G3, and of a low voltage, lower than the high voltage, for example, on the order of 0 V, to electrodes G1 and G4.

During an image acquisition period, the sensor is illuminated and electrons resulting from the creation, by absorption of a photon, of an electron-hole pair in the photoconversion area are stored in the potential wells which fill up proportionally to the illumination of the corresponding pixel. The illumination light needs to cross electrodes 9 and insulation layer 11. The thickness of the active region of the sensor, essentially formed by substrate 1 and layer 3, is sufficient to absorb the photons, whatever their wavelengths in the wanted spectrum.

After the acquisition period, a transfer period is provided, during which the charges stored in the potential wells are transferred in the direction indicated by arrows 13, in parallel for the plurality of columns and in series for the pixels of a same line 5, towards read and/or storage circuits. The charge shifting is ensured by successive modifications of the voltages applied to the electrodes.

FIG. 2 schematically illustrates a simple four-phase mode of transfer of the charges from one well to an adjacent well by switching, between high and low states, of voltages $\Phi 1$, $\Phi 2$, $\Phi 3$, $\Phi 4$ applied to electrodes G1, G2, G3, G4 of each pixel.

At a time t0 corresponding to the end of an image acquisition period, charges, shown by the hatched areas of the drawings, are stored in the potential wells formed by application of a high voltage on electrodes G2 and G3 and of a low voltage on electrodes G1 and G4.

At a time t0+T, T being the period of the clock driving the charge transfer, the voltages applied to electrodes G2 and G4 are switched. Thus, the shifting of the potential wells causes the synchronized shifting of the charge packets to the right. To ease the transfer, electrode G4 will be set to the high voltage before electrode G2 is set to the low voltage.

At a time t0+2T, the voltages applied to electrodes G1 to G3 are switched. At a time t0+3T, the voltages applied to electrodes G2 and G4 are switched. Finally, at a time t0+4T, the voltages applied to electrodes G1 and G3 are switched.

Thus, at the fourth clock period after time t0, the charges stored in a potential well in front of a pixel have been shifted towards a potential well in front of an adjacent pixel of the same line. At the sensor output, the shifted charge packets may be converted into electric voltages by adapted circuits, to form an image signal.

Of course, the transfer period is short as compared with the acquisition period. As an example, the acquisition period is on the order of from 20 to 50 ms and the electrode switching clock frequency may be greater than 2 MHz, which provides a transfer time shorter than 2 ms for a line of 1,000 pixels and a shifting in four phases.

To decrease the transfer period and to simplify the electrode switching circuits, two-phase charge-coupled devices have been provided.

FIG. 3 schematically shows a portion of an example of a two-phase charge-coupled device. FIG. 3 is a cross-section view along the same plane as FIG. 1B, previously described. The structure of the sensor of FIG. 3 resembles that of the four-phase image sensor described in relation with FIGS. 1A to 1C. In the two-phase sensor, as in the four-phase sensor, a pixel is defined, in each line, by four successive electrodes G1 to G4. Layer 3 is divided into alternating columns of two different doping levels, under electrodes 9. In the shown example, the columns of layer 3 under electrodes G1 and G3 have a doping of a first level N1 and the columns of layer 3 under electrodes G2 and G4 have a doping of a second level N2 greater than N1. Electrodes G1 and G2 on the one hand and G3 and G4 on the other hand are interconnected, for example, by metallization levels, not shown.

FIG. 4 schematically illustrates the storage, during an image acquisition period, of electrons photogenerated in potential wells formed by application of voltages $\Phi 1$, $\Phi 2$ to electrodes G1, G2, G3, G4 of each pixel. FIG. 4 further illustrates a simple two-phase mode of electron transfer, from one well to an adjacent well, by switching between high and low states of voltages $\Phi 1$ and $\Phi 2$.

At a time t0 corresponding to the end of an image acquisition period, charges shown by the hatched areas of the drawing are stored in potential wells formed by application of a low voltage, for example, on the order of 0 V, on electrodes G1 and G2 and of a high voltage, for example, on the order of 5 V, on electrodes G3 and G4. When two adjacent electrodes are set to a same voltage, the photogenerated electrons are stored in the corresponding N-layer portion of highest doping level (level N2 of FIG. 3). Further, when two adjacent electrodes are set to respectively high and low voltages, the electrons are stored in the N layer region under the high-voltage electrode.

Thus, at time t0, charge packets corresponding to points of the acquired image are stored in the N layer, mainly under electrodes G4 of each pixel.

At a time t0+T, T being the period of the clock driving the charge transfer, voltages Φ1 and Φ2 applied to electrodes G1, G2 and G3, G4 are switched to increase the electrostatic potential under electrodes G1 and G2 and to decrease the electrostatic potential under electrodes G3 and G4. This results in a displacement of the potential wells, which causes the synchronized shifting of the charge packets to the right. Thus, at the second clock period after time t0, the charges stored in a potential well under a pixel have been shifted towards a potential well under an adjacent pixel of the same line.

As an example, for an electrode switching clock frequency greater than 2 MHz, the transfer time is shorter than 1 ms for a line of 1,000 pixels and a shifting in two phases.

A disadvantage of two-phase CCDs of the type described in relation with FIG. 3 is that they are more difficult to form than four-phase sensors. Indeed, the adjacent columns of the two-phase sensor differ by their doping level. For the manufacturing of such a sensor, two successive electrode-forming sequences need to be provided. In a first sequence, a first alternation of electrodes G1, G3 (FIG. 3) is formed, at the surface of a uniformly-doped N layer at a first level N1. An implantation step is then carried out to obtain, in the regions of the N layer unmasked by first electrodes G1 and G3, a doping level N2 greater than N1. Then, in a second sequence, a second alternation of electrodes G2, G4, interposed between first electrodes G1 and G3, is formed.

Thus, a disadvantage of four-phase CCD sensors is that the switching mode of the voltages applied to the electrodes is more complex than that of two-phase sensors. A disadvantage of two-phase sensors is that they are more difficult to manufacture than four-phase sensors.

In the two- or four-phase CCD sensors described hereabove, read and/or storage circuits capable of converting the shifted charge packets into electric voltages to form an image signal are provided at the output of the charge transfer lines. Such circuits are bulky. To optimize the positioning of the output circuits and to decrease the general bulk, bidirectional CCDs capable of transferring adjacent pixel lines along opposite directions have been provided. To form such circuits, it is provided to divide each pixel line into two separate lines and to double the number of electrodes. This enables to simultaneously switch separate electrodes according to separate sequences, to control the charge transfer in two adjacent half-lines according to opposite directions.

A disadvantage of such bidirectional sensors is that the multiplication of the number of electrodes makes them more complex to manufacture than unidirectional CCD sensors. Another disadvantage of such sensors is that the switching of the voltages applied to the electrodes is more complex than that of unidirectional sensors.

A general disadvantage of the above-described CCD sensors is that the light needs to cross the polysilicon transfer control electrodes. Part of the photons are thus absorbed in the electrodes, which decreases the sensor sensitivity. To overcome this disadvantage, the transfer electrodes may be arranged next to the photoconversion region rather than above it. However, this solution has the disadvantage of increasing the bulk for a given size of the photoconversion region.

Another general disadvantage of the above-described CCD sensors lies in the fact that the charge storage capacity associated with each pixel is limited by the electrode surface area and by possible carrier recombinations.

SUMMARY OF THE INVENTION

An object of an embodiment of the present invention is to overcome all or part of the disadvantages of conventional two-phase bidirectional charge-coupled devices.

An object of an embodiment of the present invention is to provide a bidirectional two-phase charge-coupled device structure which is easy to form.

An object of an embodiment of the present invention is to provide such a sensor operating according to a simplified switching mode.

An object of an embodiment of the present invention is to provide such a sensor with an improved sensitivity and a low bulk.

An object of an embodiment of the present invention is to provide such a sensor with a large charge storage capacity.

Thus, an embodiment of the present invention provides a charge transfer device formed in a semiconductor substrate and comprising an array of electrodes distributed in rows and columns, wherein: each electrode is formed in a cavity with insulated walls formed of a groove which generally extends in the row direction, having a first end closer to an upper row and a second end closer to a lower row; and the electrodes of two adjacent rows are symmetrical with respect to a plane orthogonal to the sensor and comprising the direction of a row.

Another embodiment of the present invention provides an image sensor comprising such a charge transfer device, capable of receiving a visible radiation.

According to an embodiment of the present invention, the electrodes of a same column are interconnected and are capable of receiving shifting signals in two phases.

According to an embodiment of the present invention, said groove is formed of a main portion, oriented along a row, and of two protrusions, respectively on the side of the first end and of the second end.

According to an embodiment of the present invention, an image element corresponds to the interval between two successive electrodes of a row and two successive opposite electrodes of an adjacent row.

According to an embodiment of the present invention, the upper portion of the substrate comprises a first doped semiconductor layer of a first conductivity type of a first doping level, and a second doped semiconductor layer of a second conductivity type, covering the first layer.

According to an embodiment of the present invention, the first layer is connected to a terminal of application of a reference voltage.

According to an embodiment of the present invention, a third doped semiconductor layer of the first conductivity type covers the second layer.

According to an embodiment of the present invention, the electrodes are made of doped polysilicon insulated from the substrate by an oxide layer.

According to an embodiment of the present invention, two rows of adjacent image elements are each connected, respectively on a first side of the sensor and on a second side of the sensor, to a read device capable of converting charges into an electric image signal.

The foregoing objects, features, and advantages of the present invention will be discussed in detail in the following non-limiting description of specific embodiments in connection with the accompanying drawings.

DETAILED DESCRIPTION

As usual in the representation of integrated circuits, the various drawings are not to scale.

In the sensor examples described herein, the charge transfer electrodes are arranged vertically, across the depth of the substrate photoconversion area.

Figure 5A:
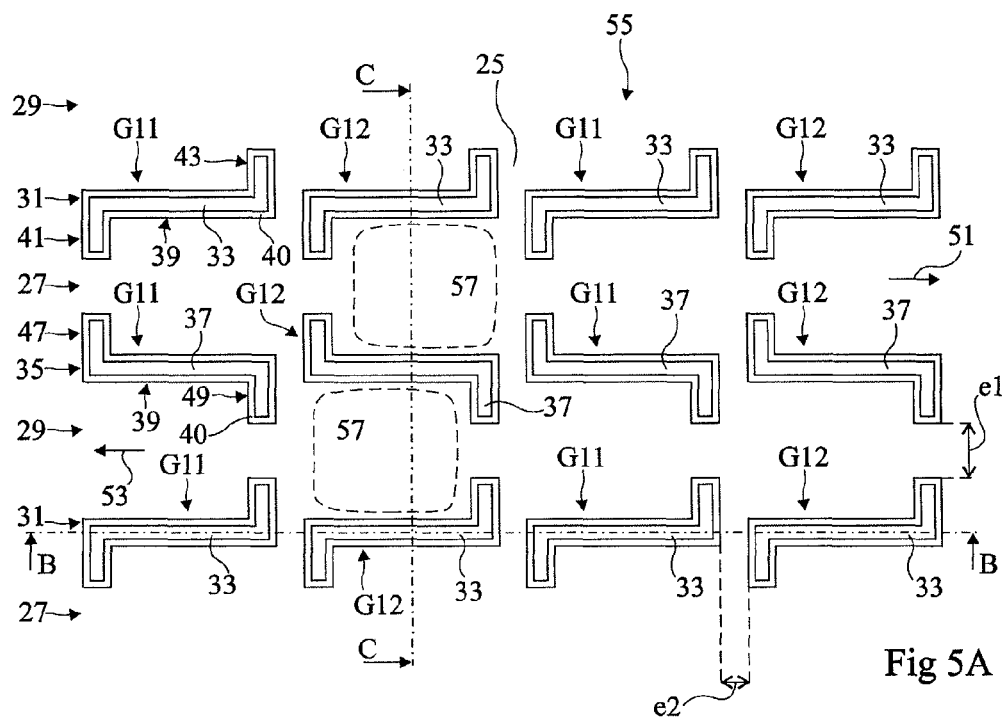
FIG. 5A is a top view schematically showing a portion of a bidirectional two-phase CCD according to an embodiment of the present invention.
Figure 5B:
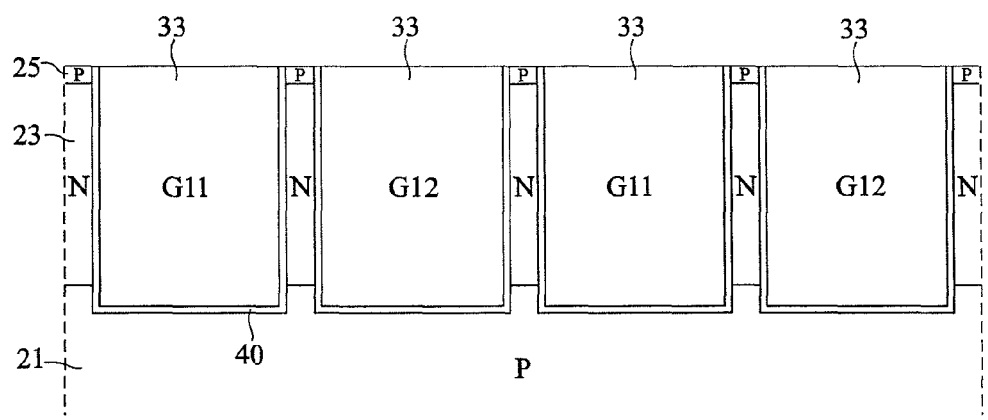
FIG. 5B is a cross-section view along plane B-B of FIG. 5A.
Figure 5C:
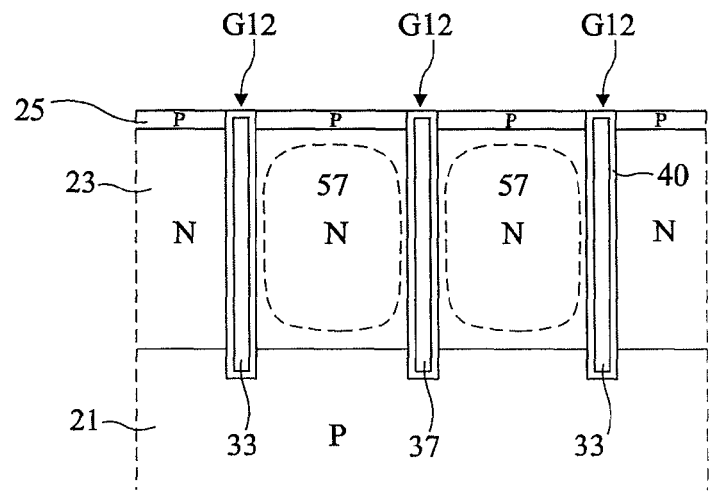
FIG. 5C is a cross-section view along plane C-C of FIG. 5A.

FIGS. 5A to 5C schematically show a portion of an example of a bidirectional two-phase charge-coupled device. FIG. 5A is a top view, FIG. 5B is a cross-section view along plane B-B of FIG. 5A, and FIG. 5C is a cross-section view along plane C-C of FIG. 5A.

Figure 6:
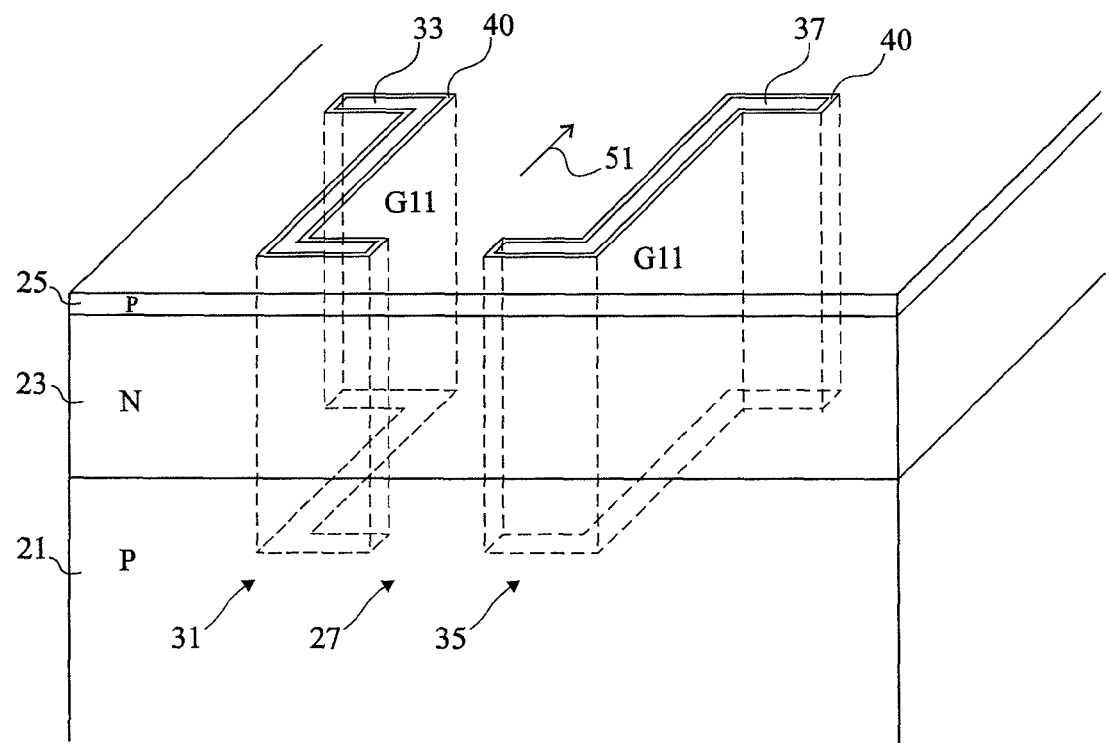
FIG. 6 is a partial perspective view of the sensor of FIGS. 5A to 5C.

FIG. 6 is a perspective view schematically showing a portion of FIGS. 5A to 5C.

An N-type doped layer 23 is arranged on a P-type doped silicon substrate 21. Layer 23 and possibly the upper portion of substrate 21 form the sensor photoconversion area. A thin P-type doped layer 25 is formed at the surface of layer 23. Layer 25 especially has the function of avoiding the presence of an interface between the upper surface of layer 23 and an upper silicon layer (not shown). Indeed, the presence of an interface between layer 23 containing charge carriers and a silicon oxide layer would result in a decrease in the number of carriers by trapping at the interface or in a dark current increase. Another function of layer 25 is to maintain a reference voltage in layer 23.

The photoconversion area is divided into a plurality of parallel lines 27 and 29, separated by an alternation of rows 31 of insulated electrodes 33 of a first type and of rows 35 of insulated electrodes 37 of a second type. Electrodes 33 and 37 extend vertically in the photoconversion area, for example, through layers 25, 23, and 21. Each electrodes is formed in a cavity filled with doped polysilicon insulated from the substrate by an oxide layer 40. This cavity comprises a main groove-shaped portion 39, oriented along a row 31 or 35, and having a protrusion at each of its ends. In the shown example, each electrode 33 comprises, towards its left-hand end, a protrusion 41 directed towards lower adjacent line 27, and towards its right end, a protrusion 43 directed towards upper adjacent line 29, and each electrode 37 comprises, towards its left end, a protrusion 47 directed towards upper adjacent line 27 and, towards its right end, a protrusion 49 directed towards lower adjacent line 29. In the shown example, protrusions 41, 43, 47, 49 have the shape of groove portions orthogonal to grooves 39, but may, however, have any other shape. The electrodes of two adjacent rows are opposite two by two along columns 55.

Electrodes 33, 37, properly biased, define in each line 27, 29, a succession of potential wells in which electric charges may be stored. In the shown example, a pixel is defined by the region between two successive electrodes G11, G12 of a row 31, and the two corresponding electrodes G11, G12 of an adjacent row 35. In practice, in this example, all the electrodes of a same column 55 are interconnected and are set to a same voltage.

The electrodes need to be arranged properly to avoid possible charge leakages from one pixel line to an adjacent line. It will preferably, for example, be chosen to arrange the electrodes so that the shortest distance e1 between two adjacent electrodes of a same column is greater than the shortest distance e2 between two adjacent electrodes of a same line.

During an image acquisition period, the upper surface of the sensor is illuminated and electrons, originating from the creation, by absorption of a photon, of an electron-hole pair in the photoconversion area, are stored in the potential wells which fill proportionally to the illumination of the corresponding pixel. Substrate 21 is connected, in operation, to a reference voltage, for example, the ground, enabling the flowing of the holes resulting from the photoconversion.

The depth of electrodes 33 and 37 is preferably selected to limit video crosstalk phenomena, that is, this depth is preferably equal to the depth of the area in which the incident photons are as a majority capable of creating electron-hole pairs (for example, 9 μm for red).

The electrodes are biased in such a way that the photogenerated electrons are stored in N-type layer 23, in a volume 57 schematically delimited by dotted lines in FIGS. 5A and 5C. It should be noted that there is no direct interface between electron storage volume 57 and oxide layer 40 for insulating electrodes 33 and 37, and no direct interface with an upper oxide layer, which avoids charge losses or a dark current increase.

To obtain a maximum charge storage capacity between electrodes, the thickness of layer 23 is preferably close to the depth of electrodes 33, 37. Thus, the photoconversion area is essentially formed by N-type layer 23.

After the acquisition period, a transfer period is provided, during which the charges stored in the potential wells are transferred in the direction of arrows 51 (from left to right in this example) for lines 27 and in the opposite direction, indicated by arrow 53, for lines 29, in parallel for the plurality of columns and in series for the pixels of a same line, towards read and/or storage circuits. The charge shifting is ensured by successive switchings in two phases, between high and low states, of the voltages applied to electrodes G11 and G12.

A specific shape of electrodes 33 and 37 has been described hereabove. Generally, each electrode is formed in a cavity with insulated walls formed of a groove which generally extends in the row direction, having a first end closer to an upper row and a second end closer to a lower row. The electrodes of two adjacent rows are symmetrical with respect to a plane orthogonal to the sensor and comprising the direction of a row.

Figure 7:
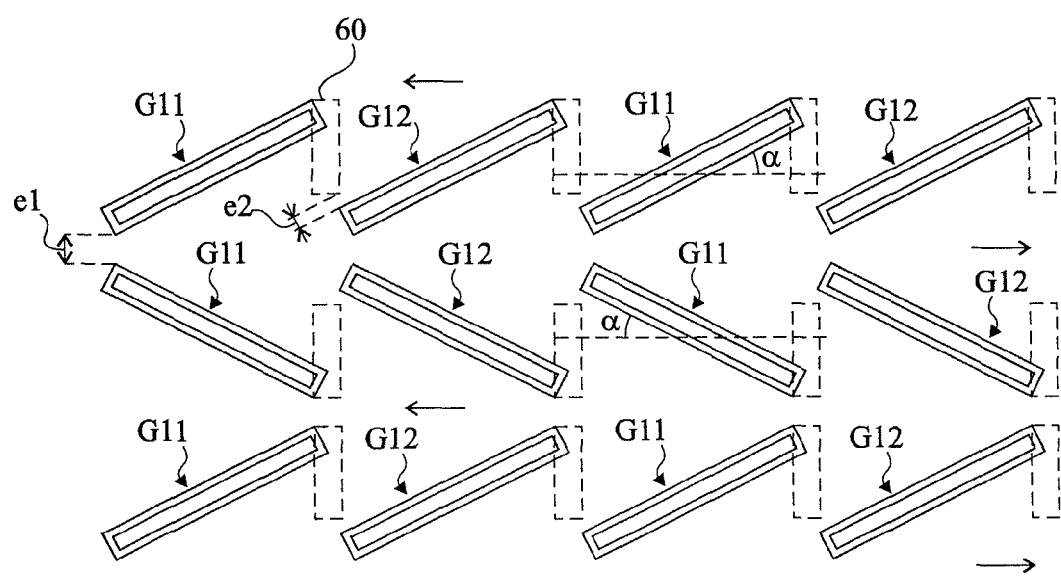
FIG. 7 is a top view schematically showing a portion of another example of a bidirectional two-phase CCD according to an embodiment of the present invention.

FIG. 7 is a top view schematically showing another example of the shape of electrodes of a bidirectional two-phase CCD. Each electrode is formed in a parallelepipedal cavity with insulated walls formed of a groove filled with doped polysilicon, forming an angle α, for example, ranging between 10 and 45 degrees, with the row direction. The electrodes of two adjacent rows are symmetrical with respect to a plane orthogonal to the sensor and comprising the direction of a row.

The electrodes need to be arranged properly to avoid possible charge leakages from a pixel line to an adjacent line. A protrusion 60 shown in dotted lines, arranged so that the shortest distance e1 between two adjacent electrodes of a same column is greater than the shortest distance e2 between two adjacent electrodes of a same line, may for example be provided at one end of each electrode.

Figure 8:
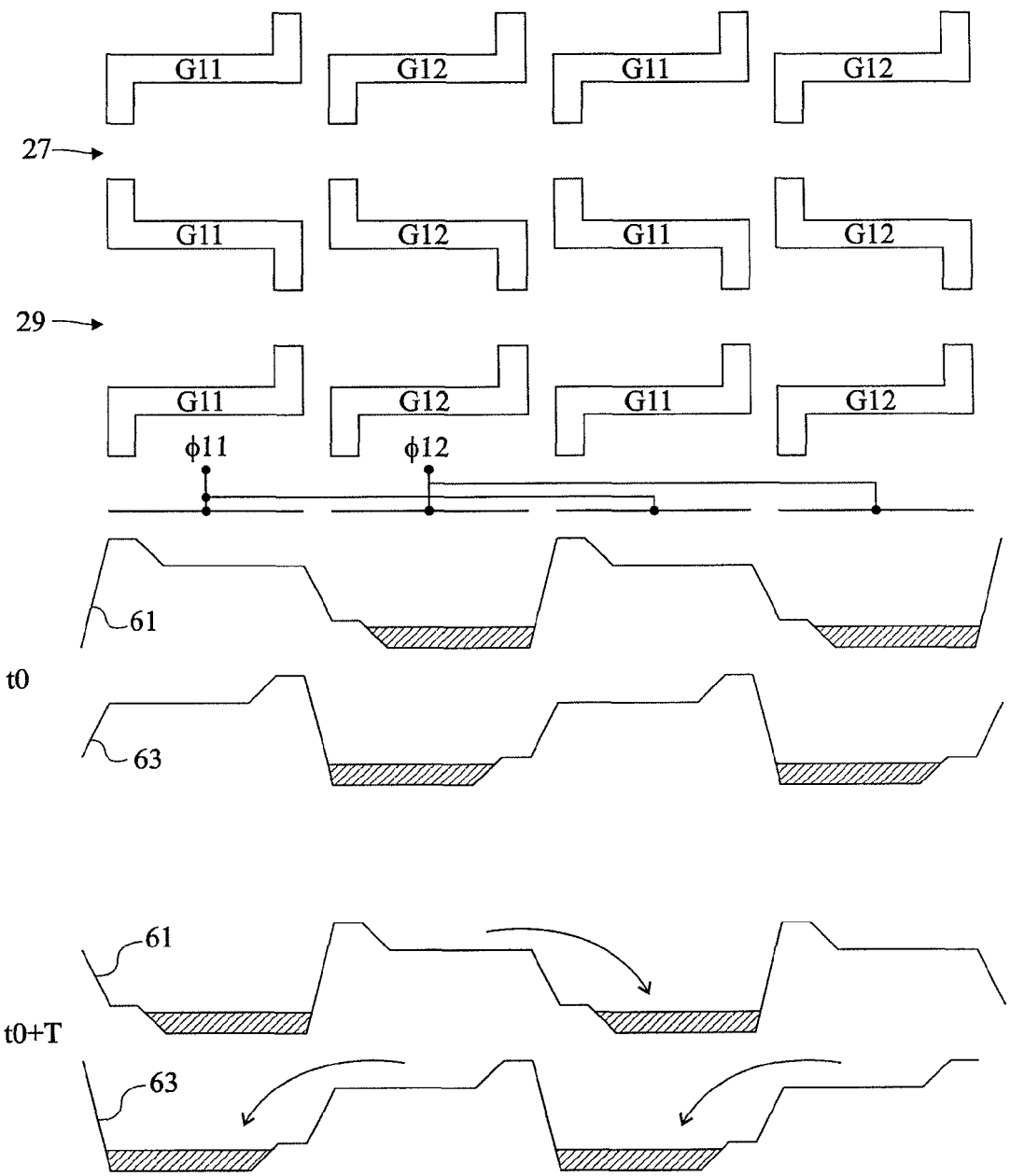
FIG. 8 schematically illustrates the charge transfer in the bidirectional two-phase CCD described in relation with FIGS. 5A to 5C and 6.

FIG. 8 schematically illustrates the storage, in an image acquisition period, of electrons photogenerated in potential wells formed by application of voltages Φ11, Φ12 to electrodes G11, G12 of each pixel of the CCD sensor described in relation with FIGS. 5A to 5C and 6. FIG. 8 further illustrates a simple two-phase mode of electron transfer, from one well to an adjacent well, by switching between high and low states of voltages Φ11 and Φ12. Curves 61 and 63 show the shape of the potential wells respectively in adjacent lines 27 and 29.

At a time t0 corresponding to the end of an image acquisition period, charges, shown by the hatched areas of the drawing, are stored in potential wells formed by application of a low voltage, for example, on the order of 0 V, on electrodes G11 and of a high voltage, for example, 5 V, on electrodes G12. When two opposite electrodes G11 are set to a same voltage, the electrons photogenerated in line 27 or 29 which runs between these two electrodes are mainly stored in the region of the N layer between the electrode portions exhibiting no protrusion towards this line. In the example discussed herein, the electrons are stored on the right-hand side of the electrodes in lines 27 and on the left-hand side of the electrodes in lines 29. Further, when two pairs of adjacent opposite electrodes are set to respectively high and low voltages, electrons are stored in the region of the N layer comprised between the high-voltage electrodes. Thus, at time t0, in a given line, charge packets are stored in the N layer, mainly in the region between electrode portions G12 exhibiting no protrusion towards this line (volume 57 of FIGS. 5A and 5C).

Any other electrode biasing mode during the acquisition phase may be envisaged. As an example, a same positive, negative, or zero voltage may be applied to electrodes G11 and G12 during the acquisition phase to decrease dark currents. In this case, the charges are stored in two separate potential wells, before being gathered in a same well (volume 57 of FIGS. 5A and 5C) at the time of the transfer.

At a time t0+T, T being the period of the clock for driving the charge transfer, voltages Φ11 and Φ12 applied to electrodes G11 and G12 are switched. The shifting of the potential wells causes the synchronized shifting of the charge packets to the right in lines 27 and to the left in lines 29, in the shown example. Thus, at the second clock period after time t0, the charges stored in a potential well under a pixel have been shifted to a potential well under an adjacent pixel of the same line, the shifting being performed according to opposite directions for adjacent lines.

An advantage of the described CCD sensor is that it is simple to form. As an example, an N-type doped semiconductor layer is formed by epitaxy on a P-type doped substrate. The upper portion of the N-type layer is P-type doped. Narrow trenches are formed by etching in the substrate. These trenches are insulated from the substrate by an oxide layer, then filled with doped polysilicon forming the electrodes. A contact is taken on each electrode.

Another advantage of the described CCD sensor is that the light for illuminating the sensor does not cross the charge transfer control electrodes. The sensitivity of the sensor is thus improved and its bulk does not increase with respect to prior art solutions.

According to another advantage of the described CCD sensor, the charge storage capacity associated with a pixel is greater than that of prior art solutions for a same pixel surface. Indeed, in the provided embodiment, the dopant concentration and the volume of the N layer of the potential wells are greater than when the electrodes are arranged at the sensor surface. Further, the storage capacity may be adjusted by increasing or decreasing the distance between two electrode lines.

According to another advantage of the described CCD sensor, the voltages implemented for the charge transfer may be decreased with respect to prior art solutions since two adjacent electrodes of a same column cooperate to create the potential wells.

Specific embodiments of the present invention have been described. Various alterations and modifications will occur to those skilled in the art. In particular, an embodiment of a front-side illuminated CCD sensor has been discussed hereabove. It will be within the abilities of those skilled in the art to implement the desired operation for a back-side illuminated CCD sensor. Further, it will be within the abilities of those skilled in the art to implement the desired operation by inverting the conductivity types of the semiconductor layers and by accordingly modifying the applied voltages. Doped polysilicon electrodes and silicon oxide insulating regions have further been mentioned in the above description. It will be within the abilities of those skilled in the art to implement the desired operation whatever the type of conductive material used to form the electrodes and whatever the insulating material used to form the insulating regions.

Embodiments of bidirectional two-phase charge-coupled devices have been described hereabove. However, the present invention does not only apply to image sensors. It will also be within the abilities of those skilled in the art to form a bidirectional two-phase charge transfer shift register according to an above-discussed embodiment, where the charges are not photogenerated, but injected, for example, upstream of the transfer lines.

Further, arrays of electrodes forming rows and columns have been described hereabove, electrodes of two symmetrical rows being symmetrical with respect to a plane orthogonal to the sensor and comprising the direction of a row. It will be within the abilities of those skilled in the art to provide, for the upper and lower sensor rows, any adapted electrode shape, for example, electrodes which are not symmetrical to those of the corresponding adjacent row.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A multidirectional two-phase charge transfer device formed in a semiconductor substrate and comprising an array of electrodes distributed in rows and columns, wherein:

each electrode is formed exclusively in a cavity with insulated walls formed of a groove which generally extends in the row direction, having a first end closer to an upper row and a second end closer to a lower row; and the electrodes of two adjacent rows are symmetrical with respect to a plane orthogonal to a surface of the semiconductor substrate and extending along a line midway between the two adjacent rows.

2. An image sensor comprising the charge transfer device of claim 1, configured to receive visible radiation.

3. The sensor of claim 2, wherein the electrodes of a same column are interconnected and are configured to receive charge-shifting signals in two phases.

4. The sensor of claim 2, wherein said groove is formed of a main portion, oriented along a row, and of two protrusions, respectively located at the first end and the second end.

5. The sensor of claim 2, wherein an image element corresponds to the interval between two successive electrodes of a row and two successive opposite electrodes of an adjacent row.

6. The sensor of claim 2, wherein the upper portion of the substrate comprises a first doped semiconductor layer of a first conductivity type of a first doping level, and a second doped semiconductor layer of a second conductivity type, covering the first doped semiconductor layer.

7. The sensor of claim 6, wherein the first doped semiconductor layer is connected to a terminal of application of a reference voltage.

8. The sensor of claim 6, wherein a third doped semiconductor layer of the first conductivity type covers the second doped semiconductor layer.

9. The sensor of claim 2, wherein the electrodes are made of doped polysilicon insulated from the substrate by an oxide layer.

10. The sensor of claim 2, further comprising:

rows and columns of imaging elements formed by the electrodes wherein each row of a plurality of the rows includes a read device configured to convert charges into an electric image signal.

* * * * *

UNITED STATES PATENT AND TRADEMARK OFFICE
CERTIFICATE OF CORRECTION

Figure 1A:
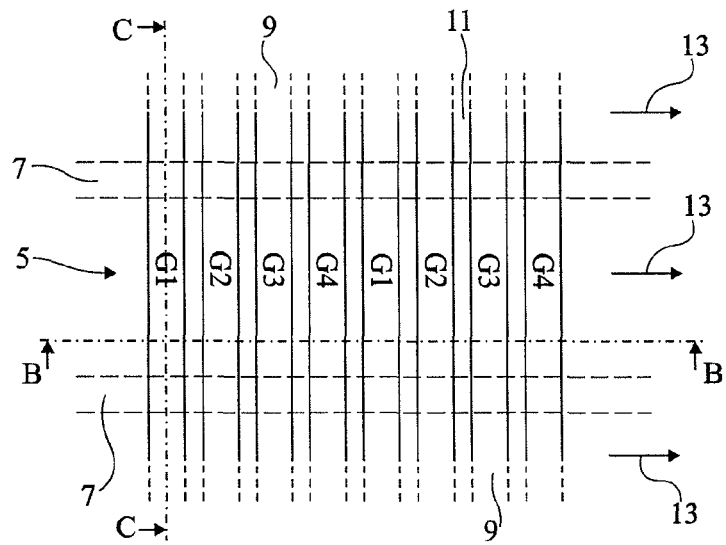
FIG. 1A, previously described, is a top view schematically showing a portion of a four-phase CCD sensor.
Figure 1B:
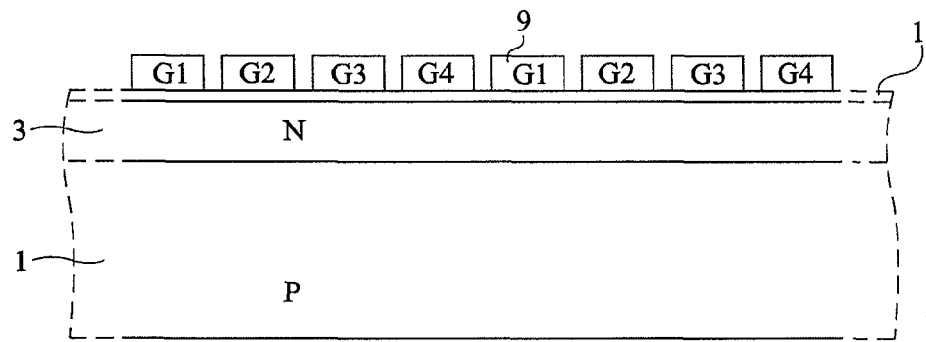
FIG. 1B, previously described, is a cross-section view along plane B-B of FIG. 1A.
Figure 1C:
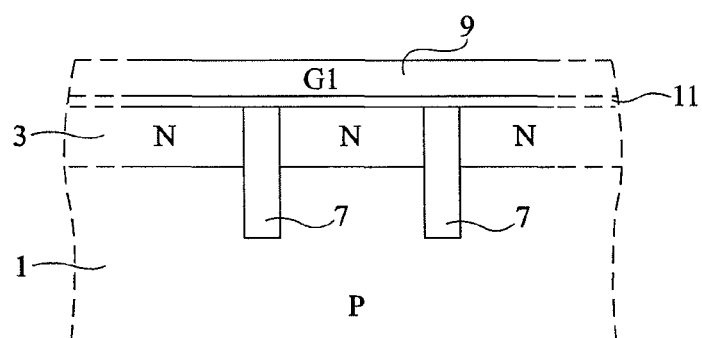
FIG. 1C, previously described, is a cross-section view along plane C-C of FIG. 1A.
Figure 2:
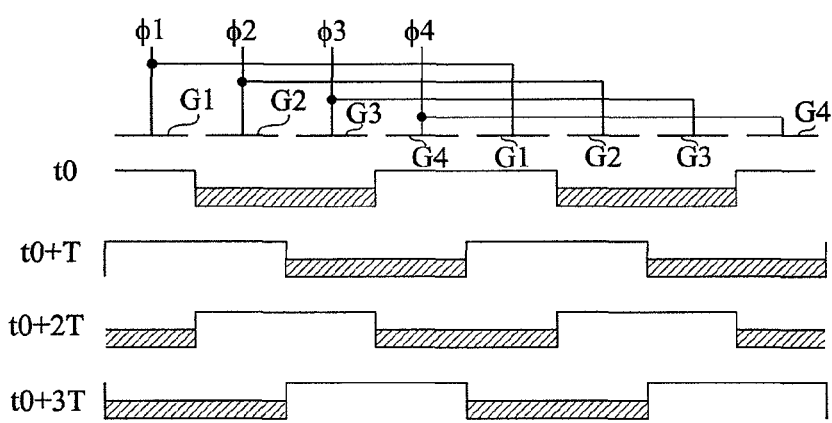
FIG. 2, previously described, illustrates the charge transfer in a four-phase CCD sensor.
Figure 3:
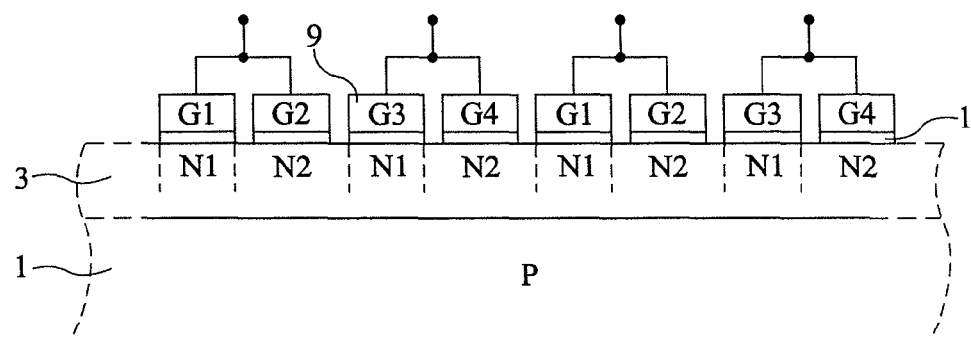
FIG. 3, previously described, is a cross-section view schematically showing a portion of a two-phase CCD.
Figure 4:
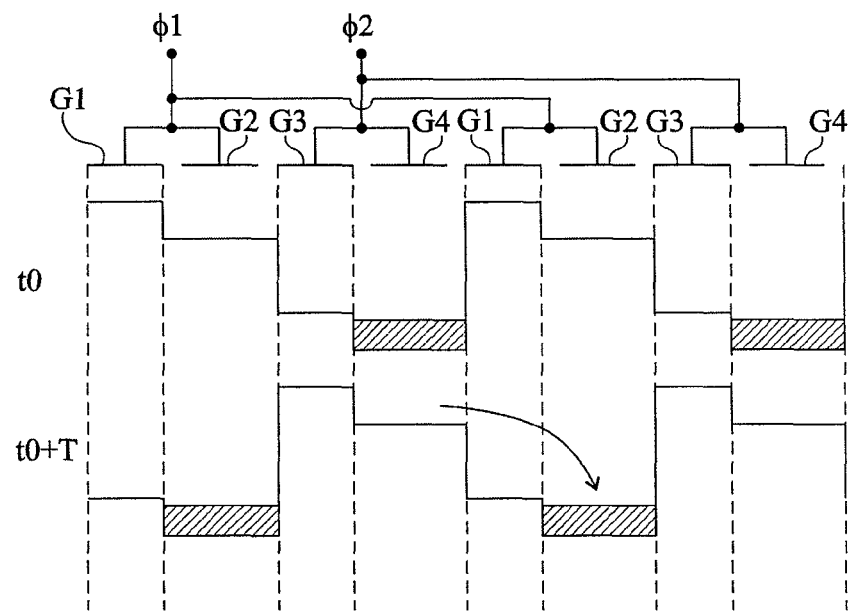
FIG. 4, previously described, illustrates the charge transfer in a two-phase CCD.

PATENT NO.        : 8,643,063 B2                                                 Page 1 of 1
APPLICATION NO.   : 12/821785
DATED             : February 4, 2014
INVENTOR(S)       : François Roy It is certified that error appears in the above-identified patent and that said Letters Patent is hereby corrected as shown below:

\*\*In the Specification:

At column 5, ln 10, in the BRIEF DESCRIPTION OF THE DRAWINGS section,
"FIG. 10" should read as follows: --<u>FIG. 1C</u>--.\*\*

Signed and Sealed this
Thirteenth Day of May, 2014

Michelle K. Lee
*Deputy Director of the United States Patent and Trademark Office*